United States Patent [19]

Akagawa

[11] Patent Number: 4,957,406
[45] Date of Patent: Sep. 18, 1990

[54] APPARATUS FOR TRANSFERRING DISKS FROM ONE CASSETTE TO ANOTHER WITH DIFFERENT PITCH

[75] Inventor: Minoru Akagawa, Fremont, Calif.

[73] Assignee: Intelmatec Corporation, Fremont, Calif.

[21] Appl. No.: 349,399

[22] Filed: May 8, 1989

[51] Int. Cl.$^5$ .............................................. B65G 65/04
[52] U.S. Cl. ..................................... 414/416; 414/404; 414/750; 414/908
[58] Field of Search ............... 414/403, 404, 416, 749, 414/750, 908

[56] References Cited

U.S. PATENT DOCUMENTS

| | | | |
|---|---|---|---|
| 3,542,224 | 11/1970 | Warren | 414/416 |
| 3,805,943 | 4/1974 | Warren | 414/416 X |
| 3,920,128 | 11/1975 | Baker | 414/416 X |
| 3,929,234 | 12/1975 | Warren | 414/416 X |
| 4,329,112 | 5/1982 | Glover | 414/416 X |
| 4,573,851 | 3/1986 | Butler | 414/404 |
| 4,597,819 | 7/1986 | Kusuhara et al. | 414/331 X |
| 4,645,401 | 2/1987 | Hopkins et al. | 414/416 X |
| 4,787,806 | 11/1988 | Aupperle | 414/416 |
| 4,856,957 | 8/1989 | Lau et al. | 414/404 |

FOREIGN PATENT DOCUMENTS 236714 6/1986 Fed. Rep. of Germany ...... 414/416

Primary Examiner—Robert J. Spar
Assistant Examiner—Robert S. Katz
Attorney, Agent, or Firm—Flehr, Hohbach, Test, Albritton & Herbert

[57] ABSTRACT

An apparatus is provided for transferring disks with center holes such as semiconductor wafers from one cassette of an ordinary kind to another having a different pitch. The apparatus has an elongated rod on which an array of disk-shaped pieces each capable of supporting a wafer from its center hole is slidably mounted. These pieces are so connected that the separation between each of mutually adjacent pairs can vary but not to exceed a predetermined maximum distance. The piece at one end of the array is affixed to the rod and the one at the other end is attached to a power source and is moved along the rod.

9 Claims, 3 Drawing Sheets

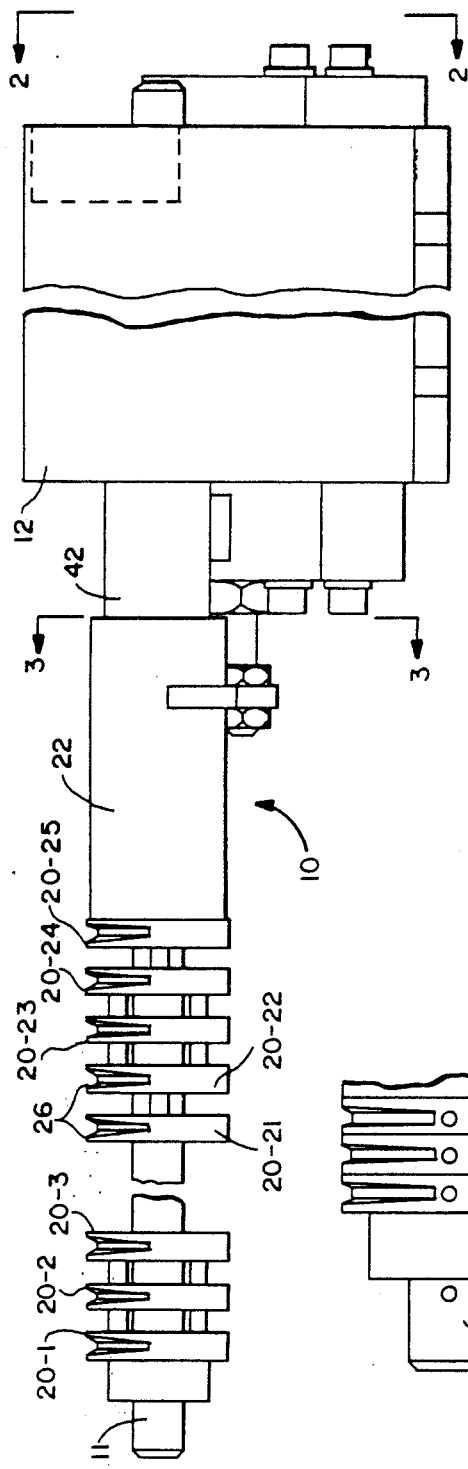
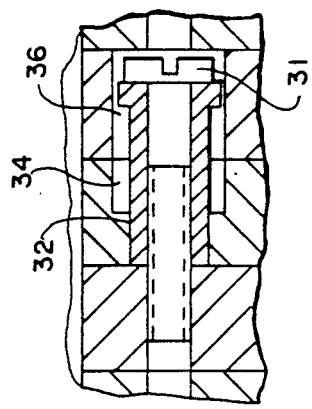
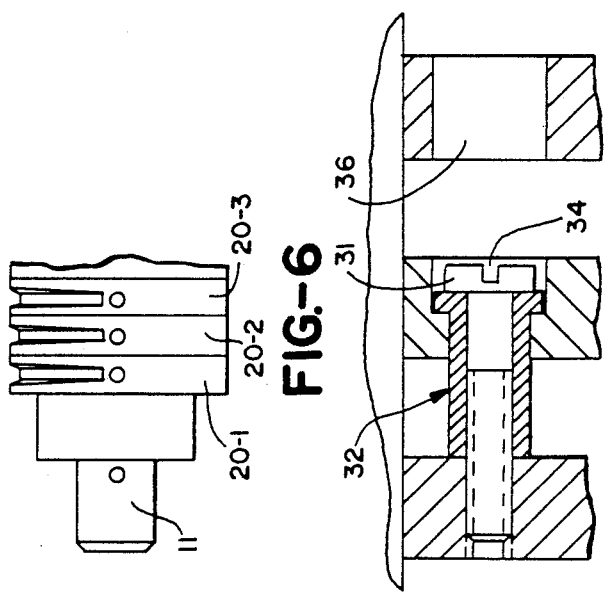

APPARATUS FOR TRANSFERRING DISKS FROM ONE CASSETTE TO ANOTHER WITH DIFFERENT PITCH

BACKGROUND OF THE INVENTION

This invention relates to an apparatus for transferring disks such as semiconductor wafers each having a center hole from one cassette of a conventional type to another cassette of a similar conventional type but having a different pitch.

Semiconductor wafers are fragile or otherwise easily rendered useless by contamination or abrasion. Therefore, they are usually carried in a cassette for transporting from one work station to another during processing. A cassette used for such a purpose is shaped generally like a box or a cage with a bottom opening, having walls with grooves at a constant pitch as disclosed, for example, in U.S. Pat. Nos. 4,311,427 issued Jan. 19, 1982, 4,471,716 issued Sept. 18, 1984, 4,493,418 issued Jan. 15, 1985 and 4,743,156 issued May 10, 1988. A plurality of (typically 25) disks are positioned in such a cassette, maintained vertically and parallel to one another. In order to save space, wafers in such a cassette are separated from one another only by a small distance of typically about a quarter of an inch. When the wafers undergo a washing process, however, individual wafers cannot be washed effectively if they are aligned so close to one another. For this reason, another cassette is usually provided for such a purpose with wafer-supporting grooves on the walls separated by a larger distance, say, about one-half inch. Thus, wafers which have been brought to a washing station are taken out in a piece-by-piece fashion from their usual cassette used generally for their transportation and transported into this specially provided cassette with grooves spaced wider apart. Transferring wafers thus from one cassette to another with a different pitch is a troublesome procedure, whether done manually or by a robot.

SUMMARY OF THE INVENTION

It is therefore an object of the present invention to provide an apparatus for efficiently transferring disks such as semiconductor wafers having center holes from one cassette of a conventional type having walls with disk-supporting grooves to another cassette similarly structured but having grooves with a different pitch.

An apparatus embodying the present invention is characterized as having an elongated rod for passing through the well aligned center holes of wafers placed regularly in such a cassette. An array of a plurality (the same number as the number of wafers in the cassette) of serially concatenated, generally disk-shaped wafer-supporting pieces is mounted to this rod. One of these pieces at one end of the array is secured to the rod but the others are slidable longitudinally along the rod. Each mutually adjacent pair of these serially concatenated pieces in the array is connected together but not rigidly such that the separation between such pairs is variable but cannot exceed a predetermined maximum distance. Each of these pieces is formed with a groove at the top for accepting therein from above an inner periphery of a wafer so as to support the wafer from its center hole. The piece at the other end of the array is in a directly motion-communicating with a shaft which an be driven longitudinally along the rod.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 1 is a partially sectional side view of an apparatus embodying the present invention, FIG. 6 is a portion of FIG. 1 when the wafer-supporting pieces are pressed against one another, FIG. 7 is a sectional view of a portion of three mutually adjacent ones of the wafer-supporting pieces for showing their connecting mechanism when the pieces are pulled away from one another, and FIG. 8 is a sectional view of a portion of the same three pieces shown in FIG. 7 when they are pressed towards one another.

DETAILED DESCRIPTION OF THE INVENTION

Figure 3:
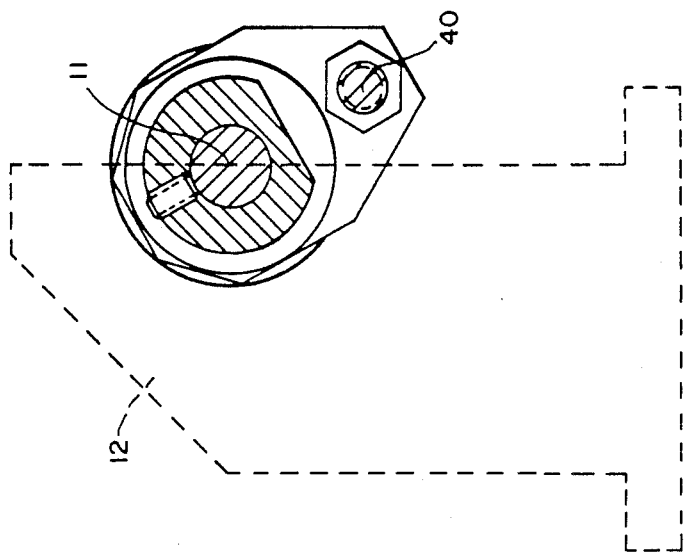
FIG. 3 is a sectional view of the apparatus of FIG. 1 taken along the line 3—3 of FIG. 1.
Figure 2:
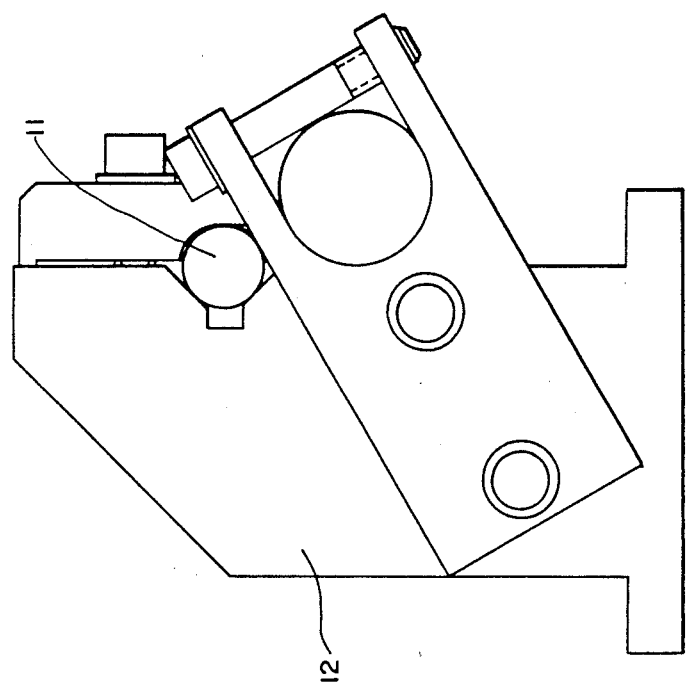
FIG. 2 is a back view of the apparatus of FIG. 1 taken along the line 2—2 of FIG. 1.

FIGS. 1, 2 and 3 show an apparatus 10 embodying the present invention for transferring disks having center holes such as semiconductor wafers from a cassette of a conventional structure having walls with disk-supporting grooves formed at a first pitch to another similarly structured cassette with disk-supporting grooves formed at a second pitch which is different from the first pitch. The apparatus has an elongated slender rod 11 affixed to a motor housing 12 and horizontally extending therefrom. A plural number (25) of generally thin, disk-shaped wafer-supporting pieces 20-1, 20-2, . . . 20-25 (or 20, collectively) are vertically mounted on the rod 11 serially, the first of these pieces (20-1) being affixed to the rod 11 near its protruding end distal from the motor housing 12 but the others of these pieces (20-2, . . . 20-25) having a throughhole for passing the rod 11 therethrough and being slidable longitudinally along the rod 11 without rotating therearound. The last of these pieces (20-25) is affixed to a supporting member 22 which is provided with an internal retainer ring and a linear ball bearing (not shown) so as to be freely slidable longitudinally along the rod 11.

Figure 5:
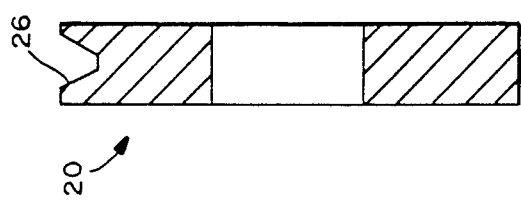
FIG. 5 is a sectional view of the piece taken along the line 5—5 of FIG. 4.
Figure 4:
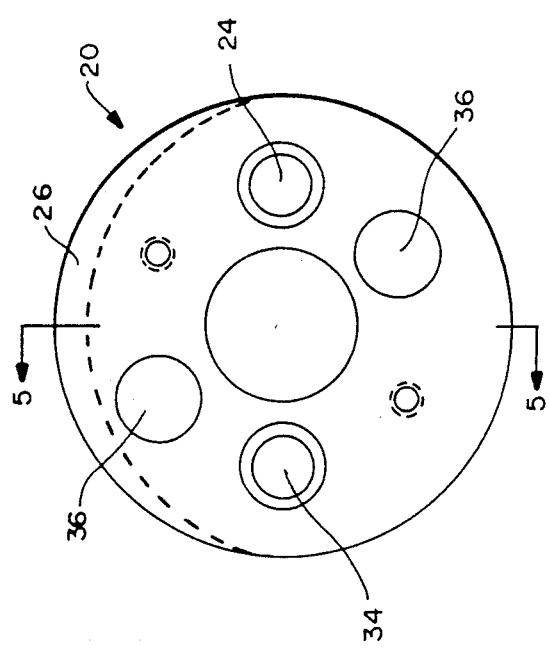
FIG. 4 is a plan view of one of the wafer-supporting pieces.

The rod 11 with the supporting pieces 20 mounted thereon is intended to be inserted penetratingly through the well aligned center holes of wafers supported in a cassette of a conventional structure. For this reason, the area of each supporting piece 20 as seen longitudinally is smaller than that of the center hole of the wafers. Since each of the supporting pieces 20 is intended to lift up one of the wafers in the cassette by supporting it by its internal edge, each disk-shaped supporting piece 20 is provided with a sectionally V-shaped groove 26 at a top part as shown in FIGS. 4 and 5 for dependably accepting the inner peripheral edge of a wafer bordering upon its center hole.

The wafer-supporting disk-shaped pieces 20 are serially concatenated to one another in such a way that the separation between each mutually adjacent pair thereof can change between a minimum value (corresponding to the aforementioned first pitch) and a specified maximum value (corresponding to the aforementioned second pitch). In other words, the connections of these pieces 20 are not rigid. Throughout herein, it is to be understood that the separation between mutually adjacent ones of these pieces 20 is defined as the distance by which two wafers supported thereby in their grooves 26 are separated. Thus, the aforementioned minimum value is basically determined by the thickness of each piece 20 because the grooves 26 are similarly formed in the individual ones of the pieces 20 and the minimum separations occur when the pieces 20 are all pressed together as shown in FIG. 6. FIG. 1, by contrast, shows the apparatus 10 when the separations of the mutually concatenated pieces 20 are at the maximum corresponding to the second pitch.

The mechanism by which the disk-shaped pieces 20 are connected together is explained next by way of FIG. 7 showing three of them 20-i, 20-(i+1) and 20-(i+2) which are mutually adjacent to each other (dummy index i being between 1 and 23, inclusive). For the convenience of explanation, these three representative pieces are referred to as the first piece, the second piece and the third piece, respectively.

With reference to FIG. 7, numeral 31 indicates a pan head screw adjustably attached to the first piece 20-i, protruding horizontally towards the second piece 20-(i+1). As shown in FIG. 4, two of these screws 31 are attached at diametrically opposite positions but only one of them is shown in FIG. 7 for the purpose of describing the connection mechanism. With reference back to FIG. 7, numeral 32 indicates a sleeve through which the screw 31 is passed and the second piece 20-(i+1) is provided with throughholes 34 as shown in FIG. 4 for the screws 31 and the sleeves 32 to pass through. Each of the throughholes 34 has a smaller diameter on the side opposite the first piece 20-i than on the side opposite the third piece 20-(i+2), the diameter changing abruptly in the middle. The sleeve 32 has its end distal from the first piece 20-i extending radially outward such that this radially extending end part can pass through the wider part of the throughhole 34 but not through the narrower part. Thus, the maximum separation between the first piece 20-i and the second piece 20-(i+1) occurs, when the radially extending part of the sleeve 32 backed by the head of the screw 31 comes into contact with the center part of the throughhole 34 where its inner diameter changes abruptly as shown in FIG. 7. The third piece 20-(i+2) is provided with throughholes 36 each with diameter large enough to allow the head of the screw 31 and the protruding end of the sleeve 32 to pass through. This is such that these three pieces can be pressed against one another as shown in FIG. 8 to minimize the separations therebetween.

In connection with the explanation of the connection mechanism given above, it is to be understood that the dummy index i takes each value between 1 and 23, inclusive. In other words, each of the 25 disk-shaped supporting pieces 20 (except the end ones) serves simultaneously as the first piece, the second piece and the third piece. This can be seen, for example, in FIG. 4 which shows a representative one of these pieces 20 having not only two screws 31 attached thereto (serving as the first piece) but also throughholes of two kinds 34 and 36 (serving as the second and third pieces). In still other words, each of the middle pieces 20-j (dummy index j being between 3 and 23, inclusive) serves as the first piece with respect to the pieces 20-(j+1) and 20-(j+2), as the second piece with respect to the pieces 20-(j−1) and 20-(j+1), and the third piece with respect to the pieces 20-(j−2) and 20-(j−1). In order to be able to play these three roles simultaneously, these pieces 20-j each have a pair of diagonally oppositely positioned screws 31, a pair of diagonally oppositely positioned throughholes 34 with internal steps and a pair of diagonally oppositely positioned throughholes 36 without internal steps, each of these diagonally oppositely positioned pairs being in mutually rotated positional relationships with 60-degree intervals therebetween as shown in FIG. 4. For example, the screws 31 attached to one of the pieces 20 and those attached to its adjacent piece are in an angularly displaced relationship by 60 degrees. This holds similarly with respect to the throughholes 34 and 36 formed in mutually adjacent pairs of the pieces 20. Although not separately described, a similar mechanism is provided between the two pieces 20-24 and 20-25 closest to the stopper 42 such that their maximum separation is the same as the aforementioned maximum separation between the other mutually adjacent pairs of pieces 20.

As shown in FIG. 1 the supporting member 22 is securely affixed to a driver shaft 40 of a motor (not shown) enclosed inside the motor housing 12 such that the supporting member 22 can be moved longitudinally along the rod 11 which is affixed to the motor housing 12. Numeral 42 in FIG. 1 indicates a stopper for the member 22. The supporting member 22 is firmly affixed to the last (or the 25th in this example) of the serially mounted wafer-supporting disk-shaped pieces 20. The rod 11 is sufficiently long such that when the supporting member 22 is pulled towards the stopper 42, the wafer-supporting disk-shaped pieces 20 can be separated by their maximum separation distances as shown in FIG. 1. As the supporting member 22 is pushed from this position away from the stopper 42, the separations between mutually adjacent pairs of these pieces 20 are sequentially diminished from the pairs proximal to the supporting member 22 until the situation depicted in FIG. 6 is realized with all pieces 20 pressed mutually against one another, their separations then assuming the aforementioned minimum value.

Let us now consider a typical situation where wafers are placed on a cassette of a conventional kind for transporting them from one work station to another, that is, a cassette with walls having grooves formed at a relatively small pitch of, say, 0.25 inch. What is desired now is to transfer these wafers from this cassette to another one having grooves formed at a larger pitch of, say, 0.5 inch. For this purpose, the apparatus 10 described above is so dimensioned that the separation of mutually adjacent pairs of these wafer-supporting pieces 20, or the separation between their grooves 26 when the pieces 20 are pressed together as shown in FIG. 6 is 0.25 inch and that the screws 31 are so adjusted that the separations between mutually adjacent grooves 26 become 0.5 inch. Then, the motor (not shown) inside the housing 12 is operated to move the driver shaft 40, and hence to push the supporting member 22 longitudinally along the rod 11 in the forward direction (away from the stopper 42). The wafer-supporting pieces 20 are thereby pushed forward but since the one (20-1) disposed farthest away from the stopper 42 is affixed to the rod 11 and cannot move with respect thereto, the pieces 20 bunch together as shown in FIG. 6. The separations between their grooves 26 then become uniformly 0.25 inch.

With the wafer-supporting pieces 20 assuming this bunched-up relative positions as shown in FIG. 6, the rod 11 is inserted through the tunnel formed by the well aligned center holes of the wafers placed on the aforementioned cassette of the conventional type having a small predetermined pitch. For this to be possible, it is understood that the areas of the pieces 20 and the supporting member 22 are sufficiently small and the driver shaft 40 is sufficiently close to the rod 11 with respect to the diameter of the holes in the wafers.

With the pitch of the wafers in the cassette matching that of the grooves 26 as explained above, the wafers can be lifted up, their inner peripheries bordering their center holes falling into the corresponding grooves 26, as the rod 11 is raised vertically upward. After the wafers are completely out of the cassette, supported entirely by the apparatus 10, the motor (not shown) is activated to move the driver shaft 40 backwards, that is, towards the stopper 42. Since the driver shaft 40 is affixed to the supporting member 22 which, in turn, is affixed to the closest one of the wafer-supporting pieces 20-25 and since the separation between mutually adjacent pairs of the pieces 20 cannot exceed a minimum distance which, in this case, is set to 0.5 inch, the aforementioned motion of the driver shaft 40 causes the bunched-up pieces 20 to come apart one by one until each mutually adjacent pair thereof comes to be separated by 0.5 inch. Since the wafers are now entirely supported by the pieces 20, this means that the wafers are now mutually separated by 0.5 inch. With the wafers thus separated at an increased pitch, they can be lowered into the other cassette with grooves formed at this increased pitch.

The foregoing description of a preferred embodiment of the invention has been presented for purposes of illustration and description. It is not intended to be exhaustive or to limit the invention to the precise form disclosed, and many modifications and variations are possible in light of the above teaching. For example, the source of driving power was loosely referred to as a motor but the type of power source is not intended to limit the scope of the invention. Any other mechanism for concatenating the plurality of wafer-supporting pieces may be substituted if it can serve the purpose of limiting the distance of separation between mutually adjacent pairs thereof between a predetermined minimum value and a predetermined maximum value corresponding to the pitches of grooves on cassettes between which wafers are desired to be transferred. The minimum and maximum separations given above are merely for purposes of illustration. Any such modifications and variations that may be apparent to a person skilled in the art are intended to be included within the scope of this invention.

What is claimed is:

1. An apparatus for transferring disks with center holes from one cassette to another having a different pitch, said apparatus comprising:

a rod elongated in a longitudinal direction, an array of a plurality of serially concatenated disk-supporting pieces each which support one of said disks by an edge of the center hole thereof, one of said disk-supporting pieces at one end of said array being affixed to said rod and the rest of said disk-supporting pieces being supported by said rod slidably along said longitudinal direction, connecting means each connecting together one of mutually adjacent pairs of said serially concatenated disk-supporting pieces such that the separation between each mutually adjacent pair of said disk-supporting pieces is variable but cannot exceed a predetermined maximum length, and driving means adjacent the other end of said array for causing a closest one of said disk-supporting pieces to slidingly move along said rod, whereby said rod with said disk supporting pieces may pick up disks from one cassette, change the pitch of said disks, and then deposit the disks into another cassette.

2. The apparatus of claim 1 wherein each of said disk-supporting pieces has a groove which extends perpendicularly to said rod and is capable of accepting thereinto said edge of the center hole of a disk.

3. The apparatus of claim 2 wherein said groove is sectionally V-shaped.

4. The apparatus of claim 2 wherein said disk-supporting pieces and said connecting means are so dimensioned that the separations between two of said grooves on two of mutually adjacent ones of said disk-supporting pieces are uniform and equal to a first predetermined distance when said driving means moves said pieces as far as possible in a first direction along said rod and uniform and equal to a 5. The apparatus of claim 1 wherein said driving means is rigidly connected to said closest one of said disk-supporting pieces at said other end of said array.

6. The apparatus of claim 5 wherein said driving means includes an elongated shaft which is substantially parallel to said rod and serves to move in said longitudinal direction.

7. The apparatus of claim 1 wherein said connecting means include screws each having an enlarged head, protrudingly attached to one of said disk-supporting pieces, extending parallel to said rod and penetrating a throughhole formed in adjacent one of said disk-supporting pieces, said throughhole being smaller at least in part than said enlarged head.

8. The apparatus of claim 7 wherein those of said screws attached to mutually adjacent ones of said pieces are not colinearly disposed with respect to each other.

9. The apparatus of claim 7 wherein nearly all of said pieces are further provided with a throughhole large enough for said enlarged head to pass through. second predetermined distance when said driving means moves said pieces as far as possible in a second direction along said rod opposite said first direction.

* * * * *